US008456123B2

(12) United States Patent
Nishiuchi et al.

(10) Patent No.: US 8,456,123 B2
(45) Date of Patent: Jun. 4, 2013

(54) CONVEYANCE SYSTEM AND AUTOMATED MANUFACTURING SYSTEM

(75) Inventors: Shigeto Nishiuchi, Kanagawa (JP);
Masashi Tsuyama, Kanagawa (JP);
Takahiro Nakagawa, Kanagawa (JP);
Youichi Nonaka, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 895 days.

(21) Appl. No.: 12/604,218

(22) Filed: Oct. 22, 2009

(65) Prior Publication Data

US 2010/0268370 A1    Oct. 21, 2010

(30) Foreign Application Priority Data

Oct. 22, 2008    (JP) .................................. 2008-272097

(51) Int. Cl.
*B25J 9/18* (2006.01)
*B25J 5/00* (2006.01)
*B25J 15/02* (2006.01)
*G06F 19/00* (2011.01)
*G06F 7/00* (2006.01)
*B25J 9/00* (2006.01)
*B25J 11/00* (2006.01)
*B25J 15/00* (2006.01)

(52) U.S. Cl.
USPC ............ 318/568.11; 318/568.12; 318/568.21; 700/112; 700/228; 901/2; 901/16; 901/31

(58) Field of Classification Search
USPC ........... 318/568.11, 568.12, 568.21; 700/112, 700/228; 901/2, 16, 31
See application file for complete search history.

(56) References Cited

U.S. PATENT DOCUMENTS

| 4,517,653 | A | * | 5/1985 | Tsuchihashi et al. ......... 700/252 |
| 4,699,563 | A | * | 10/1987 | Yokose ....................... 414/744.5 |
| 4,870,592 | A |   | 9/1989 | Lampi et al. |
| 5,241,792 | A | * | 9/1993 | Naka et al. ....................... 451/24 |
| 5,336,030 | A |   | 8/1994 | Ostwald et al. |
| 5,471,561 | A |   | 11/1995 | Cowgill et al. |
| 5,842,257 | A | * | 12/1998 | Tashima et al. .............. 29/25.01 |
| 6,639,879 | B2 |   | 10/2003 | Plutt et al. |
| 7,848,851 | B2 | * | 12/2010 | Nishi et al. .................... 700/264 |
| 2003/0079331 | A1 | * | 5/2003 | Batrin et al. ..................... 29/458 |
| 2003/0118436 | A1 | * | 6/2003 | Kameda et al. ............... 414/799 |
| 2005/0083795 | A1 |   | 4/2005 | Doi et al. |
| 2006/0241813 | A1 |   | 10/2006 | Babu et al. |
| 2007/0073439 | A1 | * | 3/2007 | Habibi et al. .................. 700/213 |

FOREIGN PATENT DOCUMENTS

CN    1488559 A    10/2006

* cited by examiner

*Primary Examiner* — Walter Benson
*Assistant Examiner* — Gabriel Agared

(57) ABSTRACT

A conveyance system. The conveyance system includes a movable device for conveying an article, and a robot selected from the group consisting of an articulated robot and an orthogonal robot. The movable device is configured to be both vertically and horizontally movable; and, the robot is mounted on the movable device. The robot includes a hand and a gripper disposed on the hand. The gripper is configured to hold the article. The movable device and the robot are configured to convey the article in conveyance operations that include an extraction, a conveyance, and an installation, of the article; the range of the conveyance operations lies within a working range of the robot from a present position that is selected with priority. The movable device is configured to remain in a stationary state when the article is conveyed by the robot using the conveyance operations within the working range.

10 Claims, 13 Drawing Sheets

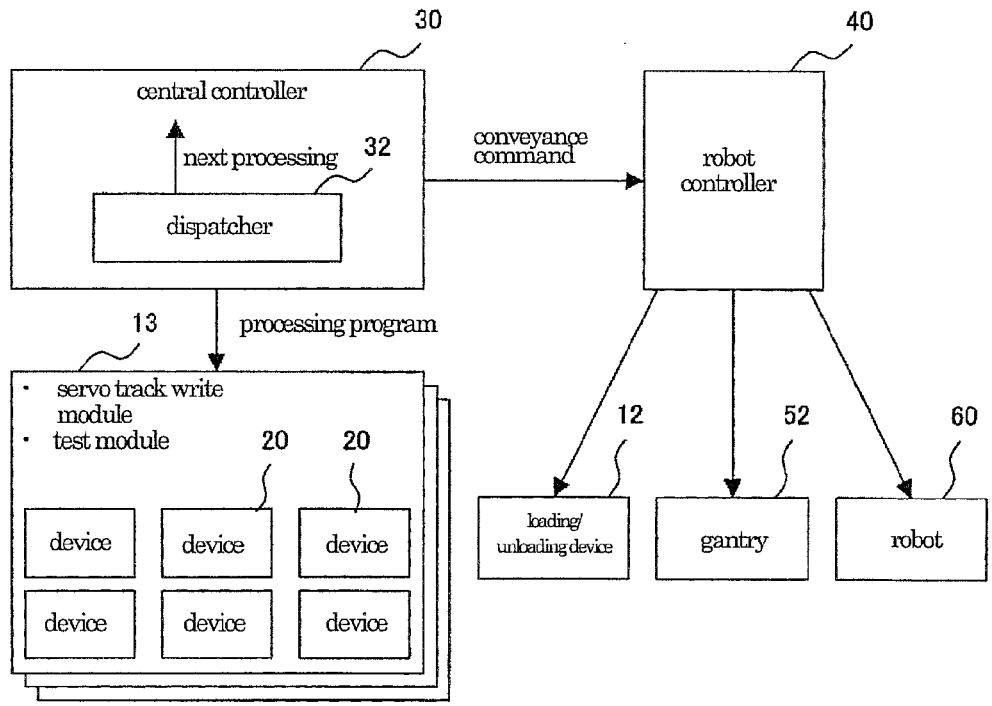

FIG. 4

REQUEST From Central Controller To Dispatcher
    HNDS, <RobotBasePositionX(mm)>,<RobotBasePositionZ(mm)>,
    <HandPositionX(mm)>, <HandPositionY(mm)>, <Hand1Status>, <Hand2Status>, ¥n
    RPAP¥n
    END_¥n
RESPONSE From Dispatcher To Central Controller
    APAP, GET, <Tool-ID>, <HDD-ID>, SINGLE,
          GET, <Tool-ID>, <HDD-ID>, SINGLE,
          SET, <Tool-ID>, <HDD-ID>, DUAL,
          SET, <Tool-ID>, <HDD-ID>, DUAL, ¥n
    END_¥n

FIG. 5

CONVEYANCE SYSTEM AND AUTOMATED MANUFACTURING SYSTEM

CROSS-REFERENCE TO RELATED APPLICATION

This application claims priority from the Japanese Patent Application No. 2008-272097, filed Oct. 22, 2008, the disclosure of which is incorporated herein in its entirety by reference.

TECHNICAL FIELD

Embodiments of the present invention relate to a conveyance system of products that are automatically processed through a plurality of continuous operations, such as: semiconductor elements, hard-disk drives (HDDs), liquid crystal displays (LCDs), plasma displays, or printed-circuit boards (PCBs). Further, the invention relates to an automated manufacturing system to which this conveyance system is applied.

BACKGROUND

With respect to manufacturing operations of advanced device products such as semiconductor elements, HDDs, LCDs, plasma displays or PCBs, in some manufacturing operations such as a treatment which requires a chemical reaction, minute working or minute assembling, there may be a case that the advanced device products are manufactured by an automated manufacturing system, such as a robot or a machine tool without allowing an operator to directly perform the operations. Furthermore, there may be a case that the manufacturing system includes several tens to several hundreds of continuous operations. In addition, there may be a case that a half-completed product, which may be referred to by the term of art, "work," is subject to a test in the course of the manufacturing process.

For example, in the manufacture of the HDDs, a plurality of magnetic-recording heads and magnetic-recording disks are assembled in the HDD together with other components such as a spindle motor and a disk enclosure; and, magnetic characteristics and a storage capacity of the HDD are tested in a plurality of continuous automated operations before the HDD is released as a product.

With respect to a PCB, minute electronic components such as semiconductor chips and capacitors are arranged on the PCB using an automatic machine; the minute electronic components are automatically affixed to the PCB in a soldering reflow furnace, and are subject to an electric test by an automatic machine before being completed as a product.

In such manufacturing operations of the products, the enhancement of the productivity of the automated manufacturing system is a crucial task from a viewpoint of recovering investments. In defining this enhancement of productivity as an output per unit time, to enhance the productivity, net operation time and auxiliary operation time are shortened. Particularly, in an automated manufacturing system, besides lowering the frequency of occurrence of perturbations to the system, shortening of the auxiliary operation time such as, shortening of a setup operation time, or alternatively, shortening of a standby time which stops the flow of work until the operation assumes a state which allows the conveyance of work are issues that draw the attention of manufacturing engineers to provide product at lower cost.

SUMMARY

Embodiments of the present invention include a conveyance system. The conveyance system includes a movable device for conveying an article, and a robot selected from the group consisting of an articulated robot and an orthogonal robot. The movable device is configured to be both vertically and horizontally movable; and, the robot is mounted on the movable device. The robot includes a hand and a gripper disposed on the hand. The gripper is configured to hold the article. The movable device and the robot are configured to convey the article in a series of conveyance operations that includes an extraction, a conveyance and an installation of the article; the range of the conveyance operations lies within a working range of the robot from a present position that is selected with priority. The movable device is configured to remain in a stationary state when the article is conveyed by the robot using the conveyance operations within the working range.

DESCRIPTION OF THE DRAWINGS

The accompanying drawings, which are incorporated in and form a part of this specification, illustrate embodiments of the invention and, together with the description, serve to explain the embodiments of the present invention:

FIG. 4 is a block diagram of the conveyance system and the automated manufacturing system shown in FIG. 1, of example 1, in accordance with embodiments of the present invention.

FIG. 5 is a view showing one example of a communication protocol between a central controller and a dispatcher in the block diagram shown in FIG. 4, of example 1, in accordance with embodiments of the present invention.

Figure 1:
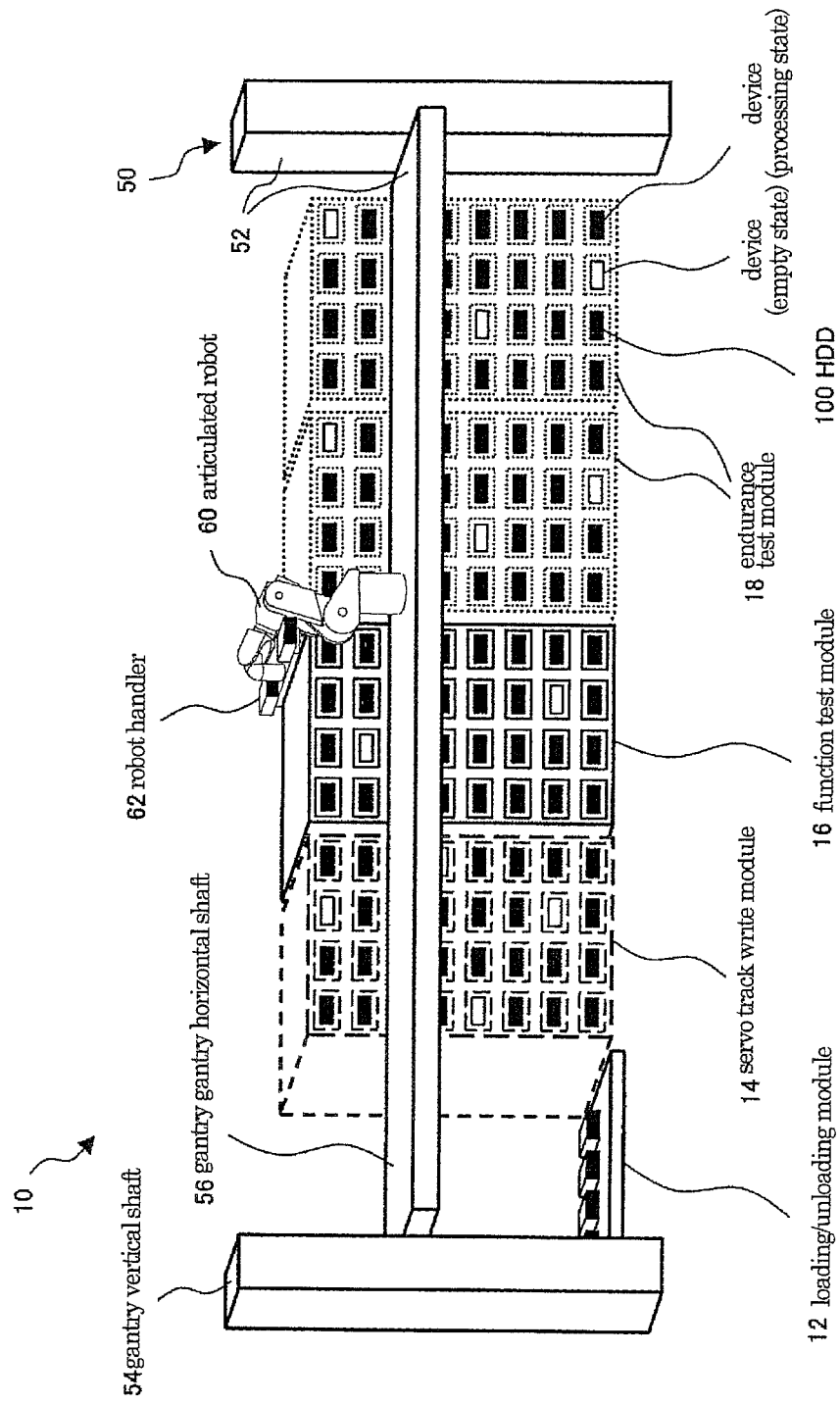
FIG. 1 is a schematic view of components of a conveyance system and an automated manufacturing system, of example 1, in accordance with embodiments of the present invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary.

Description of Embodiments of the Present Invention for Conveyance System And Automated Manufacturing System With relevance to embodiments of the present invention, in the manufacture of hard-disk drives (HDDs), the plurality of continuous automated operations includes a servo track write operation in which control signals are written in a magnetic-recording disk with respect to HDDs, and a test operation in which a function test and an endurance test are carried out with respect to HDDs. As used herein, the term of art, "operation," includes a step, as recited in some FIGS. As is known in the art, a batch-operation method includes operations, for example, in which several tens to several hundreds of HDDs are installed in a device as a batch and are processed and, thereafter, the HDDs are installed in another device of a next operation as a batch and are processed. Such a batch-operation method raises an issue (1) with respect to HDD characteristics in which even when HDDs have the same capacity, the HDDs differ in processing time due to the intrinsic performance difference in reading and writing, and another issue (2) with respect to operations that the HDDs cannot be taken out from the device until the processing of a predetermined number or more of HDDs with respect to HDDs is finished thus giving rise to a further issue that the auxiliary operation time is prolonged. That is, due to the above-mentioned issues (1), (2), in the batch operation method, the HDDs to which the processing is already applied stand by in the device until the processing of another HDD is finished. This prolongs the auxiliary operation time thus slowing productivity of the automated manufacturing system.

With further relevance to embodiments of the present invention, to deal with these issues, an individual operation method is known in the art in which the HDD is installed and processed in the device one-by-one and, thereafter, the HDD is installed and processed in the test device of a next operation one-by-one. Then, an automated manufacturing system is known in the art that embraces a mass of several tens to several thousands of devices using this method, and the method conveys the HDDs one-by-one using a robot hand to the devices for testing the HDDs. In such a system, when a plurality of HDDs, which is in a conveyance standby state for the robot hand, is not orderly conveyed, there arises an issue (a) that even when one operation is completed, a device of the next operation is filled with another HDD so that the HDD cannot be conveyed and another issue (b) that even when the device is empty, the device in the previous operation still undergoes a test so that the HDD cannot be conveyed, whereby an auxiliary operation time is prolonged, thus, slowing productivity of the automated manufacturing system.

With further relevance to embodiments of the present invention, in the above-mentioned conventional system control methods, the gantry-type horizontal/vertical movable device and the articulated robot are simultaneously moved. In general, a moving speed of the gantry-type horizontal/vertical movable device is extremely slow compared to a moving speed of the articulated robot and hence, when the horizontal/vertical movable device and the articulated robot are simultaneously moved in combination, there arises an issue that a conveyance speed of the whole system is determined based on the moving speed of the gantry-type horizontal/vertical movable device which exhibits the slow moving speed.

Therefore, embodiments of the present invention increase a conveyance speed in a conveyance system of an article to be conveyed using a robot and a gantry. Moreover, embodiments of the present invention enhance productivity in an automated manufacturing system which uses the conveyance system. To deal with the above-described issues, embodiments of the present invention are characterized in that, under certain circumstances, priority is assigned to a work in a conveyance standby state which is located in a working range of an articulated robot, and the work is conveyed by the articulated robot while keeping a gantry in a stopped state, which is a stationary state.

In accordance with embodiments of the present invention, a conveyance system is configured, for performing a series of manufacturing processes, to take out an article to be conveyed from a cell, in which the manufacturing process of one operation applied to the article to be conveyed is finished, out of articles to be conveyed which are installed in cells arranged in a matrix array, to convey the article to be conveyed to a different cell for performing the manufacturing process of a next operation, and to install the article to be conveyed in the different cell. In accordance with embodiments of the present invention, the conveyance system includes a movable device, for conveying the article to be conveyed, that is vertically and horizontally movable, and a robot selected from the group consisting of an articulated robot and an orthogonal robot, which is mounted on the movable device. In accordance with embodiments of the present invention, the robot includes a hand and a gripper disposed on the hand such that the gripper is configured to hold the article to be conveyed. In accordance with embodiments of the present invention, the movable device and the robot are configured to convey the article to be conveyed which allows a series of conveyance operations comprising an extraction, a conveyance, and an installation of the article to the conveyed within a working range of the robot at a present position that is selected with priority. In accordance with embodiments of the present invention, the movable device which is vertically and horizontally movable is configured to remain in a stationary state when the article to be conveyed is conveyed by the robot in the conveyance operations within the working range.

In accordance with embodiments of the present invention, the conveyance system is directed to an automated manufacturing system which includes: a plurality of modules in which a manufacture processing device is installed in cells arranged in a matrix array; a first control component that is configured to transmit a processing program to the manufacture processing device within the plurality of modules; a movable device that is configured to be both vertically and horizontally movable for conveying an article to be conveyed which is installed in the manufacture processing device to another manufacture processing device; and a robot selected from the group consisting of an articulated robot and an orthogonal robot that is mounted on the movable device; and a second control component that is configured to control the movable device and the robot. In accordance with embodiments of the present invention, the robot includes a hand, and a gripper disposed on the hand such that the gripper is configured to hold the article to be conveyed. In accordance with embodiments of the present invention, the first control component is configured: to recognize a working range of the robot based on a present position of the movable device and a present position of the robot; to recognize a location of the article to be conveyed in a conveyance standby state based on a processing progress state of at least one of the manufacture processing devices, or alternatively, each manufacture processing device of the manufacture processing devices; and to issue a conveyance command to the second control component while assigning high priority to the article to be conveyed within a working range of the robot and assigning low priority to the article to be conveyed outside the working range of the robot without moving the movable device. In accordance with embodiments of the present invention, the second control component is configured to control the robot and the movable device so as to convey the article to be conveyed in accordance with the priorities.

According to the invention, in the conveyance system, the work can be conveyed by operating the articulated robot while keeping the gantry in a stopped state; and, hence, it is possible to largely increase a conveyance speed under a certain condition. Furthermore, the application of such a conveyance system can contribute to the enhancement of the productivity of the automated manufacturing system. Embodiments of the present invention are next described in conjunction with examples as shown in the drawings.

Example 1

With reference now to FIG. 1, in accordance with embodiments of the present invention, a schematic view is shown of example 1 of a conveyance system and an automated manufacturing system to which example 1 of the conveyance system is applied. The automated manufacturing system 10 includes a plurality of cells arranged in a matrix array and in which HDDs, for example HDD 100, which is a magnetic-recording device, that constitute work, which are articles to be conveyed, are installed. The automated manufacturing system 10 is assigned to a self-servo track write process and a test process in a manufacturing process of the HDDs. A servo track write module 14 is provided for the self-servo track write process. In the cells of the servo track write module 14, a plurality of manufacture processing devices 20 (see FIG. 2) each of which performs self-servo track writing to one HDD is arranged. Further, the test process includes a function test and an endurance test, wherein a function test module 16 is provided for the function test, and an endurance test module 18 is provided for the endurance test, respectively. A plurality of manufacture processing devices 20 for performing the function test and the endurance test with respect to one HDD is located in each of the cells.

With further reference to FIG. 1, in accordance with embodiments of the present invention, a conveyance system 50 is configured for conveying the HDDs to these modules such that an articulated robot 60 is mounted on a gantry 52, which is a movable device, that is vertically and horizontally movable, and a robot handler 62, which is a gripper, is mounted on a hand of the robot 60. The conveyance system 50 conveys the HDDs 100 to the manufacture processing devices 20, and takes out the HDD 100 from the manufacture processing devices 20 after the completion of processing using the robot handler 62. In FIG. 1, the manufacture processing device 20, in which the HDD 100 is not installed, is in an empty state that in indicated herein by a white bordered rectangle; and, the manufacture processing device 20, in which the HDD 100 is installed, is in a processing state that in indicated herein by a black bordered rectangle. Furthermore, as a station where the HDD 100 is loaded into the system and the HDD 100 is unloaded from the system, a loading/unloading module 12 is provided. The robot handler 62 removes the HDD 100 placed on the loading/unloading module 12 and conveys the HDD 100 to the manufacture processing device 20, while the robot handler 62 conveys the HDD 100 extracted from the manufacture processing device 20 to the loading/unloading module 12. In addition to the vertical and horizontal movement brought about by a gantry vertical shaft 54 and a gantry horizontal shaft 56, the robot handler 62 can also perform three-dimensional movement and rotation, because of the articulated robot 60. That is, the conveyance system 50 has eight degrees of freedom in total due to the provision of the gantry having two axes and the robot having 6 axes so that the conveyance system 50 has two redundant degrees of freedom. Thus, even when the gantry 52 is stopped, which is a stationary state, due to the operation of the robot 60, the robot handler 62 can arrive at a desired position within a working range of the robot 60.

Figure 2:
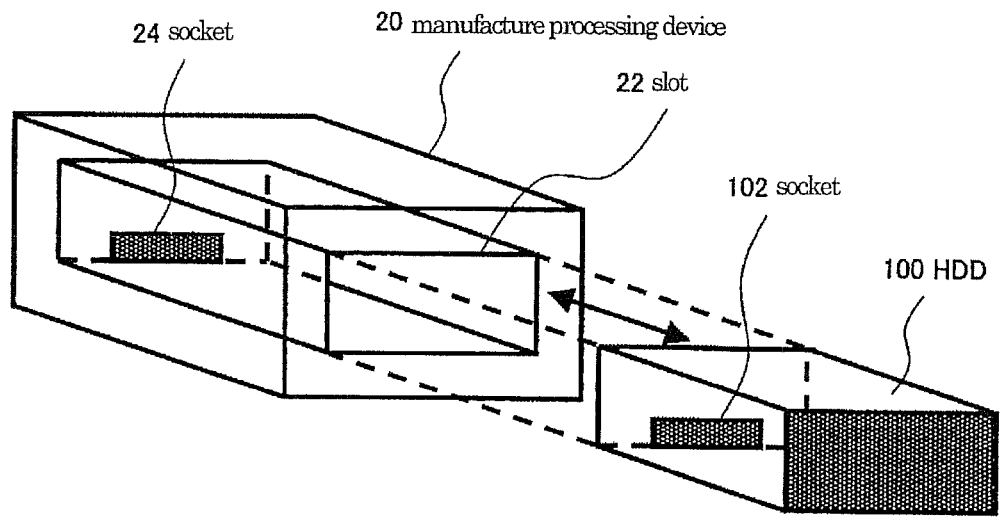
FIG. 2 is a view showing the connection relationship between a manufacture processing device and an HDD when a self-servo track write and a function test of the HDD are performed using the automated manufacturing system, of example 1, in accordance with embodiments of the present invention.

With reference now to FIG. 2, in accordance with an embodiment of the present invention, a view is shown of the connection relationship between the manufacture processing device 20 and the HDD 100 when self-servo track write processing and test processing are performed by the automated manufacturing system 10 shown in FIG. 1. A slot 22 through which the HDD 100 is installed is formed in the manufacture processing device 20, and a socket 24 which is electrically connected to the HDD 100 is located on a deep end of the slot 22. A socket 102 which corresponds to the socket 24 of the manufacture processing device 20 is formed on one side of the HDD 100. When the HDD 100 is installed in the slot 22 by the robot handler 62, the socket 102 is connected to the socket 24. Further, the HDD 100 is operated in accordance with a processing program installed in the manufacture processing device 20 so that the servo track write processing and the test processing may be performed.

Figure 3:
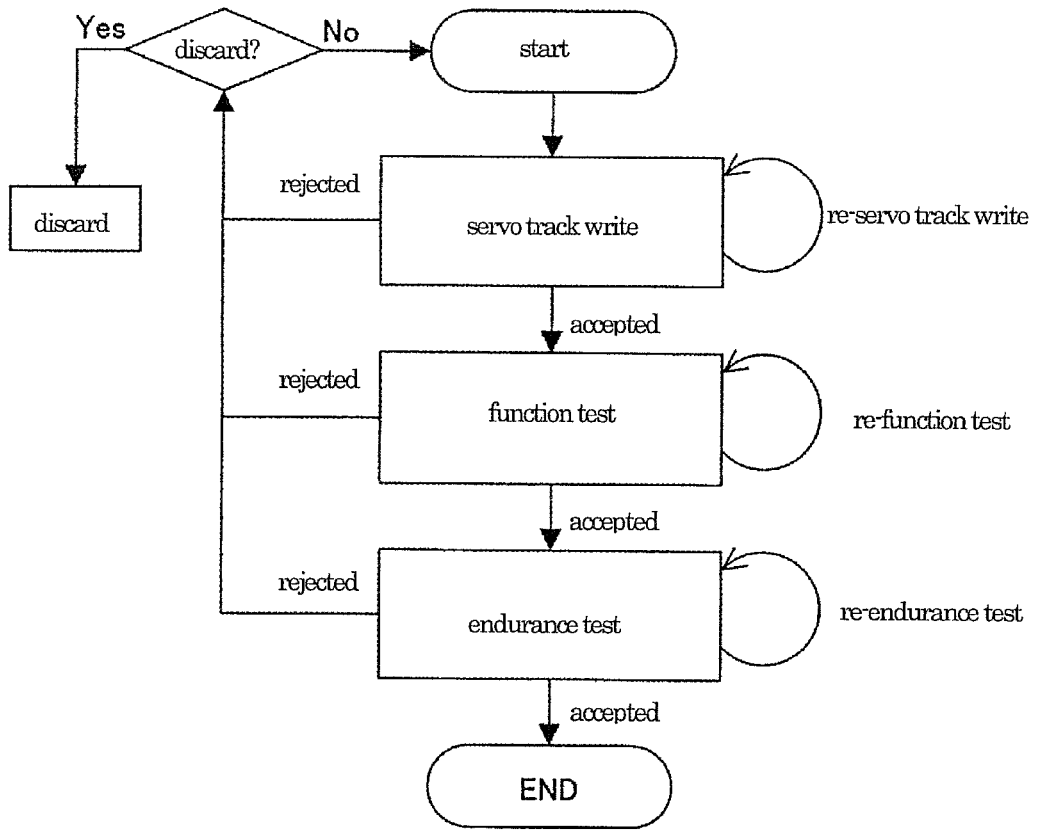
FIG. 3 is a flowchart showing a process to which the automated manufacturing system is assigned, of example 1, in accordance with embodiments of the present invention.

With reference now to FIG. 3, in accordance with an embodiment of the present invention, a flowchart is shown for schematically describing operations, which are assigned to the automated manufacturing system 10 shown in FIG. 1. First of all, the HDD is subject to servo track write processing and the accepted HDD is subject to a function test. Then, the accepted HDD is subject to an endurance test. In each processing operation, at a certain rate, the HDD is rejected or is subject to reprocessing, for example, re-servo track write processing, re-function test, or re-endurance test. The rejected work is disassembled and, thereafter, is reassembled. Then, the assembled work is subject to the above-mentioned processing again starting from the servo track write processing. However, when the work is rejected more than a certain times, the work is discarded.

With reference now to FIG. 4, in accordance with an embodiment of the present invention, a block diagram is shown of the automated manufacturing system 10 shown in FIG. 1. The automated manufacturing system 10 includes a central controller 30, a robot controller 40, a servo track write module, and a test module 13. The central controller 30 transmits a processing program to the servo track write module and the test module 13, and issues a processing start command, or a processing interruption command, to the manufacture processing devices 20, which include various apparatuses, arranged in each module. The devices 20 which are arranged in the servo track write module and the test module 13, respectively, report processing progress states to the central controller 30. The central controller 30 issues a conveyance command to the robot controller 40 so as to decide the conveyance origin and the conveyance destination of the HDD based on the processing progress state. In response to a conveyance command, the robot controller 40 performs an HDD conveyance control of the loading/unloading module 12, the gantry 52 and the robot 60. Here, a large number of devices 20 are arranged in the servo track write module and the test module 13; and, hence, the number of HDDs which are processed in the devices 20 amounts to several hundreds to thousand, or more. Thus, in the report of the processing progress states of the devices 20, a large number of reports that the processing of some HDDs is completed and, some other HDDs are in a conveyance standby state, after the completion of the processing, is always reported to the central controller 30. Accordingly, in one embodiment of the present invention, an operation plan is provided by always calculating the most efficient way in view of conveyance by selecting the HDD to be conveyed and the device to which the selected HDD is conveyed. Here, the system includes a dispatcher 32 which produces the operation plan in the central controller 30. The dispatcher 32 obtains a present position of the gantry 52 and a present position of the robot 60 and the processing progress states of the respective devices 20, and produces an operation plan so as to convey the HDDs in order starting from the HDD of the highest conveyance efficiency based on the present position of the robot handler 62.

With reference now to FIG. 5, in accordance with an embodiment of the present invention, a view is shown of one example of a communication protocol between the central controller 30 and the dispatcher 32 in the block diagram shown in FIG. 4. When the central controller 30 receives a report from the device 20 that the processing of the HDD is completed in any one of the devices 20 arranged in each module so that the HDD assumes a conveyance standby state, first of all, the central controller 30 reports the position of the gantry 52, the position of the robot 60 and the HDD which the robot handler 62 currently holds to the dispatcher 32 using a "HNDS" command. Thereafter, the central controller 30 makes an inquiry of the dispatcher 32 with respect to the HDD to be conveyed next and the destination of such an HDD using a "RPAP" command. The dispatcher 32 produces an operation plan by receiving information on the state based on the "HNDS" command from the central controller 30, and returns a result of the operation plan to the central controller 30 using an "APAP" command. Here, when the HDD is conveyed by an operation of the robot while keeping the gantry 52 in a stopped state, symbol "SINGLE" is added to an end of each conveyance operation data; and, when the HDD is conveyed by moving the gantry 52 and the robot 60 simultaneously, symbol "DUAL" is added to an end of each conveyance operation data. In the example shown in FIG. 5, the dispatcher 32 responds to the central controller 30 with a conveyance operation plan which gets two HDDs from the devices 20 in a "SINGLE" mode, and sets the two HDDs in two devices 20 in a "DUAL" mode.

Figure 6:
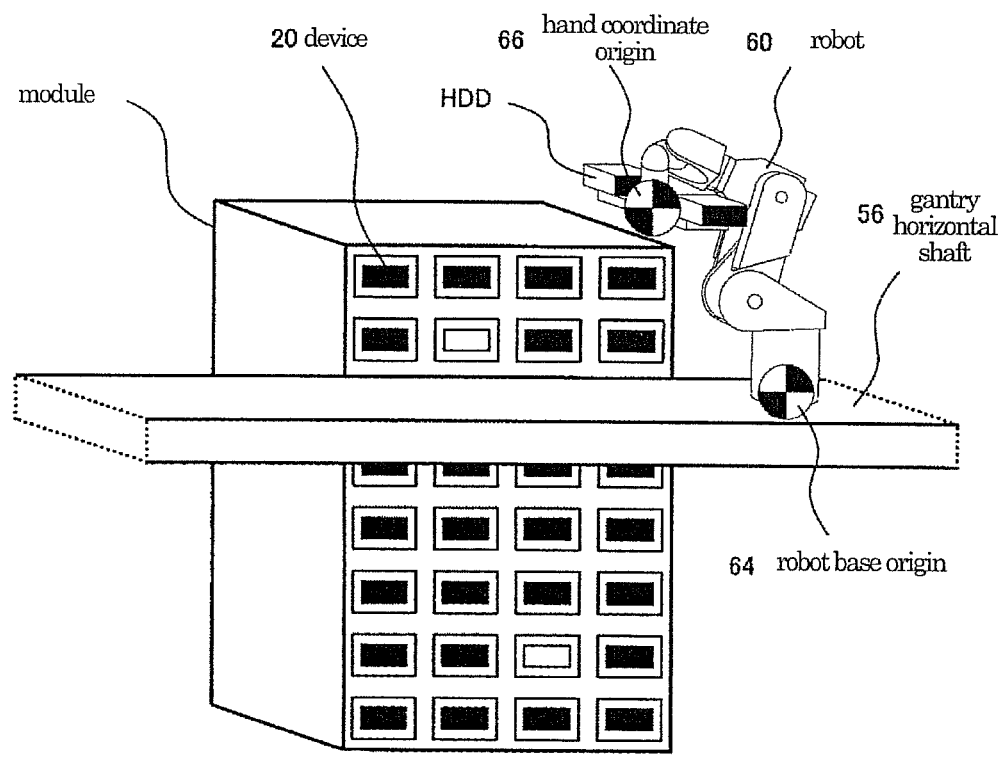
FIG. 6 is a view illustrating a model based on which an operation plan of the dispatcher shown in FIGS. 4 and 5 is made according to the conveyance system and the automated manufacturing system shown in FIG. 1, of example 1, in accordance with embodiments of the present invention.

With reference now to FIG. 6, in accordance with an embodiment of the present invention, a view is shown for describing a model based on which an operation plan of the dispatcher 32 shown in FIGS. 4 and 5 is made in the automated manufacturing system shown in FIG. 1. The dispatcher 32 obtains the position of the gantry vertical shaft 54, the position of the gantry horizontal shaft 56, and the position of a robot base origin 64. The dispatcher 32 further obtains a hand coordinate origin 66 of the robot 60, thus, identifying the device 20 in the module which is positioned closest to the HDD gripped by the robot 60, which is the positional relationship between the HDD and the device 20. Further, the dispatcher 32 calculates a working range of the robot at a present position based on the positional relationship among the gantry 52, the robot 60 and the module, and identifies the device 20 in the module that is located within the robot working range. In this manner, the dispatcher 32 always identifies the device 20 located within the working range of the robot based on the position of the gantry 52 and the position of the robot 60 which are changed from time to time.

Figure 7:
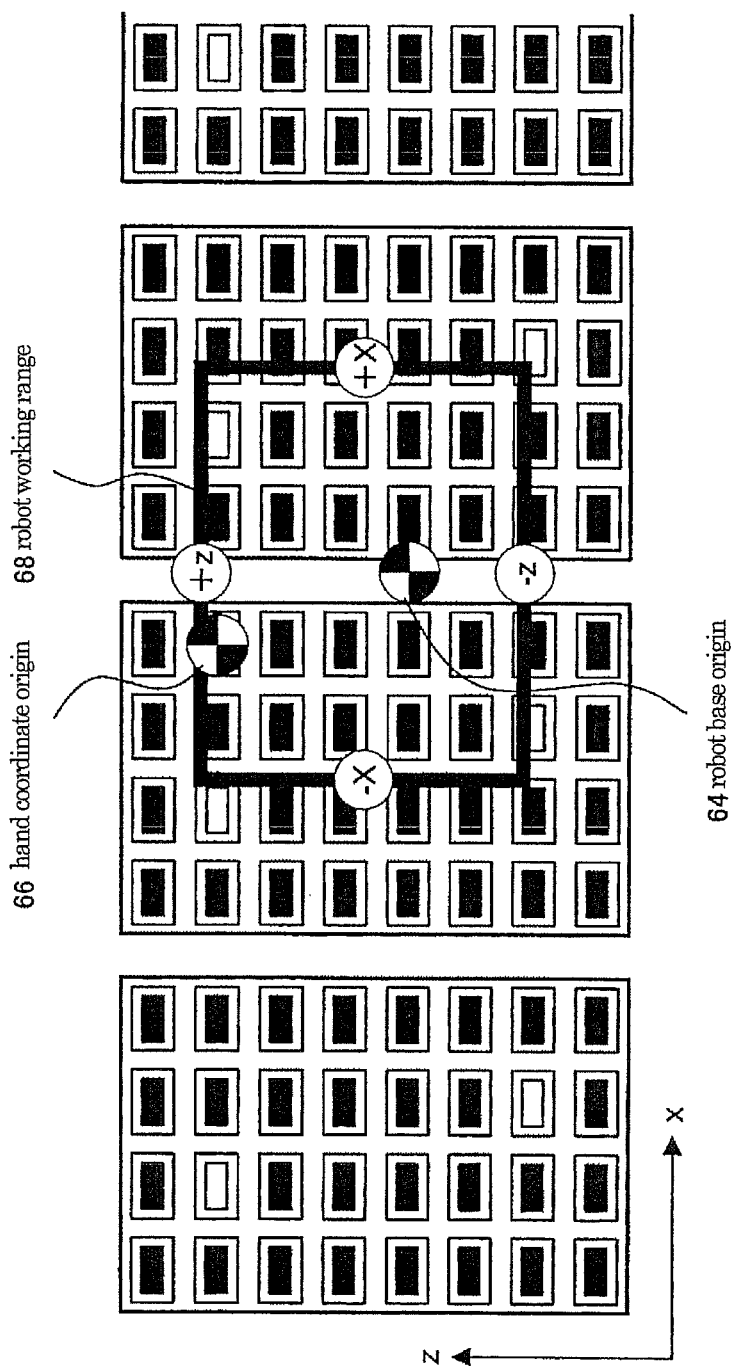
FIG. 7 is a view which projects a robot working range corresponding to present positions of a gantry and a robot as shown in FIG. 6 at present positions of devices in the modules, of example 1, in accordance with embodiments of the present invention.

With reference now to FIG. 7, in accordance with an embodiment of the present invention, a view is shown which projects a working range of the robot with the gantry and the robot as shown in FIG. 6 located at present positions of the devices arranged in the modules. The robot base origin 64 and the hand coordinate origin 66 shown in FIG. 6 are projected on the devices in the modules in FIG. 7. Furthermore, in FIG. 7, the robot working range at the present position of the robot is indicated by a rectangle outlined with bold lines. The HDDs existing in such a working range can be conveyed by operating the robot 60 while keeping the gantry 52 in a stopped state, which is a stationary state. The system includes one coordinate system, wherein an X axis is defined in the horizontal direction and a Z axis is defined in the vertical direction in FIG. 7. Thus, the robot working range can be defined by four parameters +X, −X, +Z and −Z about the robot base origin 64.

Figure 8:
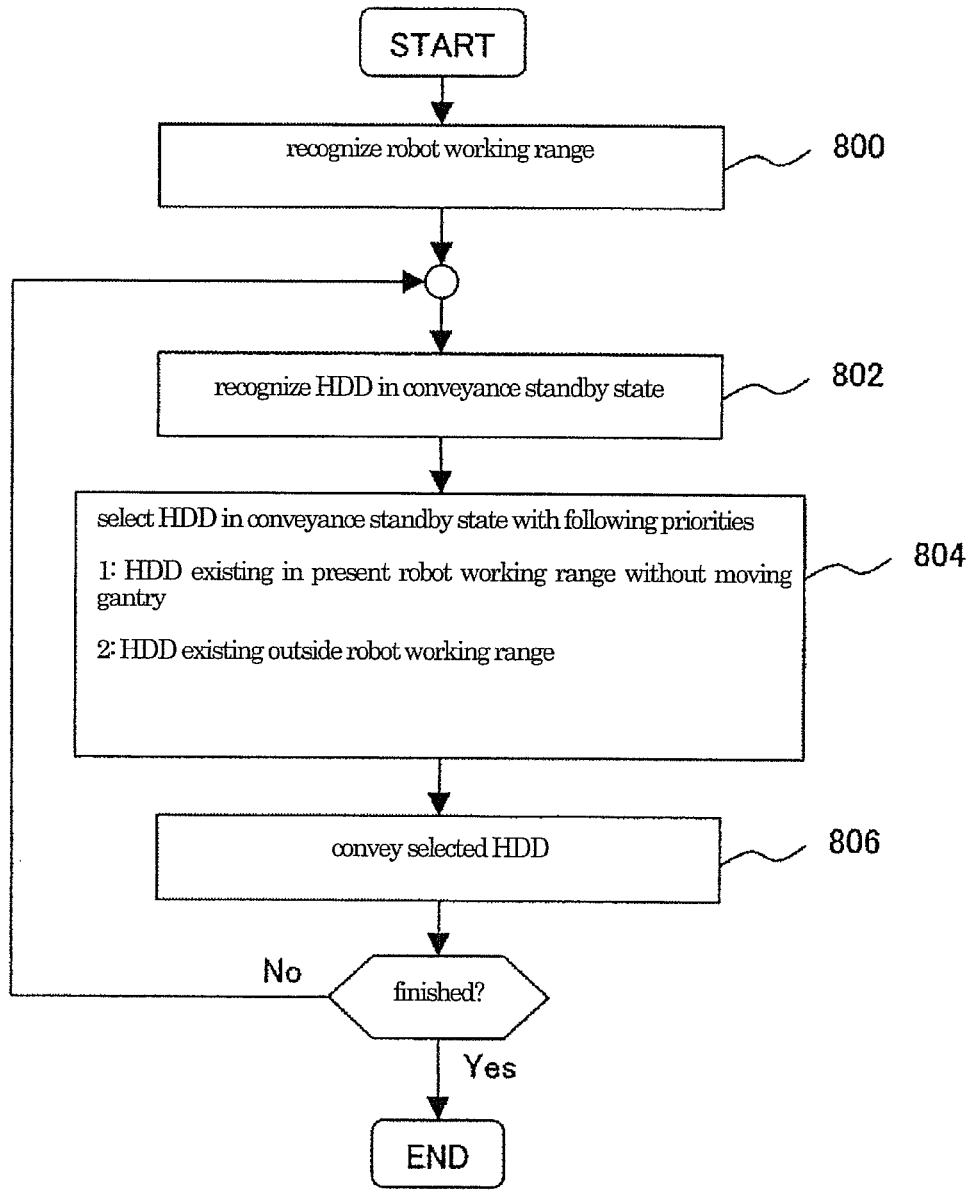
FIG. 8 is a flowchart showing an algorithm relating to example 1 when a model shown in FIGS. 6 and 7 is adopted with respect to an operation plan of a dispatcher shown in FIGS. 4 and 5, in accordance with embodiments of the present invention.

With reference now to FIG. 8, in accordance with an embodiment of the present invention, a flowchart is shown of an algorithm relating to example 1 when the model shown in FIGS. 6 and 7 is adopted with respect to the operational plan of the dispatcher shown in FIGS. 4 and 5. At 800, as described in conjunction with FIG. 7, the working range of the robot 60 is recognized. At 820, locations of the HDDs which are in a conveyance standby state in the whole system are recognized based on devices in an empty state and devices in a processing state shown in FIG. 1. At 804, the HDD to be conveyed is selected by assigning high priority to the work existing within the present robot working range and assigning low priority to the HDDs existing outside the robot working range without moving the gantry. At 806, the selected HDD is conveyed.

Figure 9:
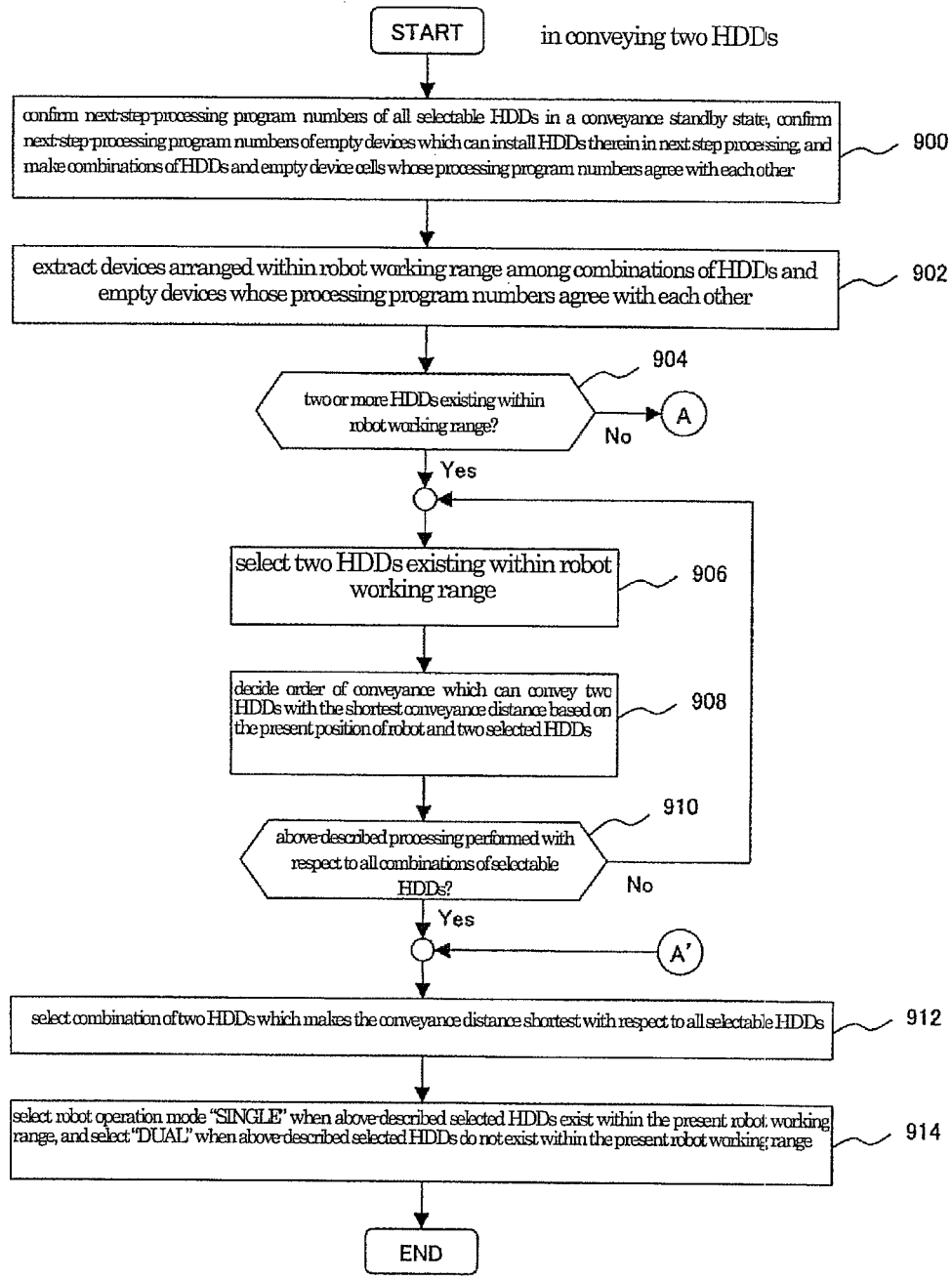
FIG. 9 is a flowchart showing a detail of the flowchart shown in FIG. 8, of example 1, in accordance with embodiments of the present invention.
Figure 10:
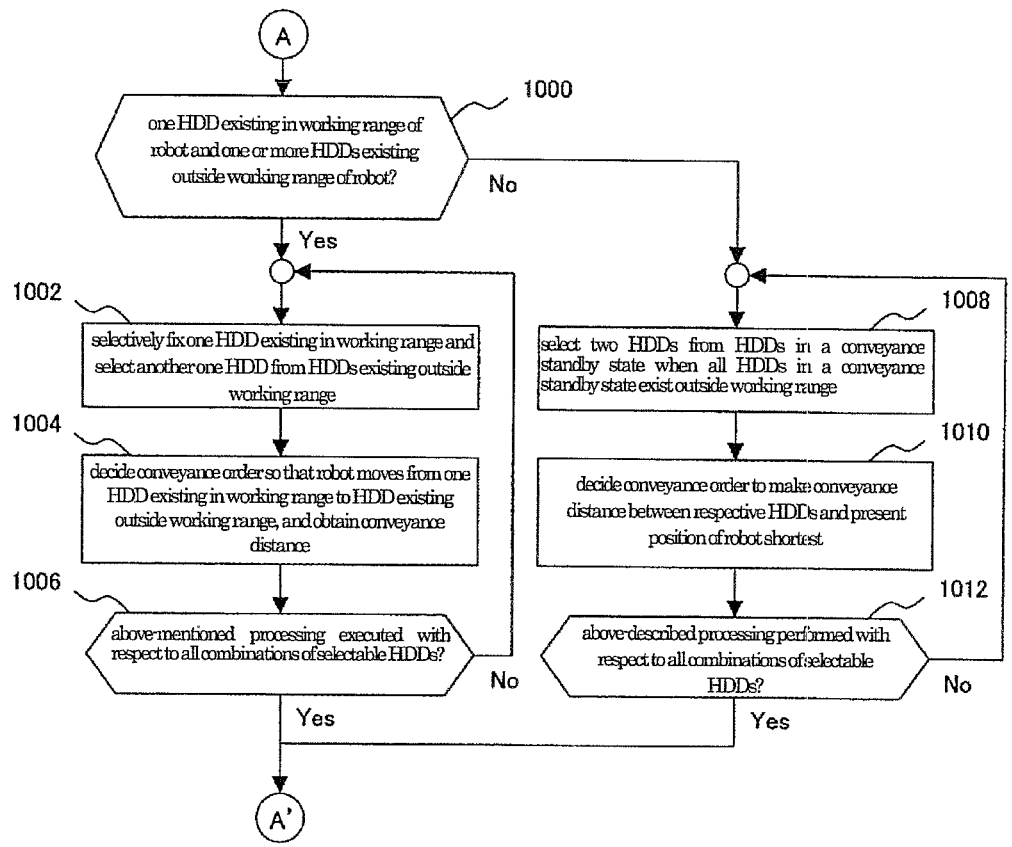
FIG. 10 is a flowchart showing a detail of the flowchart shown in FIG. 9, of example 1, in accordance with embodiments of the present invention.

With reference now to FIGS. 9 and 10, in accordance with an embodiment of the present invention, flowcharts are shown of details of the flowchart in FIG. 8. As has been described in conjunction with FIG. 4, the flowchart of FIG. 8 is formed by evaluating circumstances in which: a large number of HDDs in a conveyance standby state after the completion of the processing are placed in the respective devices; a plurality of HDDs in a conveyance standby state exists within as well as outside the robot working range at a certain time; and, the robot handler can grip two HDDs, simultaneously. Under such circumstances, to produce the most efficient conveyance plan, the HDD to be conveyed is identified based on the present position of the robot; and, a plan is produced that can shorten a distance of conveyance to a destination device in which the HDD is installed. FIG. 9 shows the most efficient conveyance plan in detail. At 900, next-step-processing program numbers of all selectable HDDs in a conveyance standby state are confirmed and next-step-processing program numbers of empty devices which can install the HDDs therein in the next operation processing are confirmed; and, the combinations of the HDDs in a conveyance standby state and the empty device cells whose processing program numbers agree with each other are made. At 902, among the combinations of the HDDs in a conveyance standby state and the empty devices whose processing program numbers agree with each other, as shown in FIG. 7, the devices located within the robot working range are extracted. At 904, the processing advances in one of two ways depending on whether or not two or more HDDs in a conveyance standby state exist within the robot working Lange. At 906, when two or more HDDs in a conveyance standby state exist within the working range of the robot, two HDDs in a conveyance standby state are selected among these HDDs in a conveyance standby state; and, at 908, the order of conveyance which can convey two HDDs with the shortest conveyance distance is decided based on the present position of the robot and the two selected HDDs in a conveyance standby state. At 910, such decision of the order of conveyance is performed with respect to all combinations of selectable HDDs in a conveyance standby state; and, at 912, the combination of two HDDs in a conveyance standby state which makes the conveyance distance shortest is selected with respect to all selectable HDDs in a conveyance standby state. At, 914, when the above-mentioned selected HDDs in a conveyance standby state exist within the present robot working range, a robot operation mode "SINGLE" is selected from data of the "APAP" command of the communication protocol shown in FIG. 5; and, alternatively, at 914, when the selected HDDs do not exist within the present robot working range, the robot operation mode "DUAL" is selected from data of the "APAP" command of the communication protocol. When a branching condition "A" that two or more HDDs in a conveyance standby state do not exist within the working range of the robot is selected in the branching-on-condition operation, the processing advances to operations shown in FIG. 10, as is next described.

With reference now to FIG. 10, in accordance with an embodiment of the present invention, at 1000, when one HDD in a conveyance standby state exists in the working range of the robot and one or more HDDs in a conveyance standby state exist outside the working range of the robot, at 1002, one HDD existing in the working range is selectively fixed and another single HDD is selected from the HDDs existing outside the working range; and, at 1004, the conveyance order is decided so that the robot moves from one HDD existing in the working range to the HDD existing outside the working range; and, a conveyance distance is obtained. At 1006, such processing is calculated with respect to all HDDs in a conveyance standby state located outside the working range; and, the processing returns to a branching condition "A'" in the branching of the conditions in FIG. 9. On the other hand, at 1000, when the HDDs in a conveyance standby state exist only outside the working range of the robot, at 1008, two HDDs are selected from such HDDs; at 1010, the conveyance order is decided to make the conveyance distance between the respective HDDs and the present position of the robot shortest; at 1012, such processing is calculated with respect to all HDDs in a conveyance standby state; and, the processing returns to the branching condition "A'" in FIG. 9.

Figure 11:
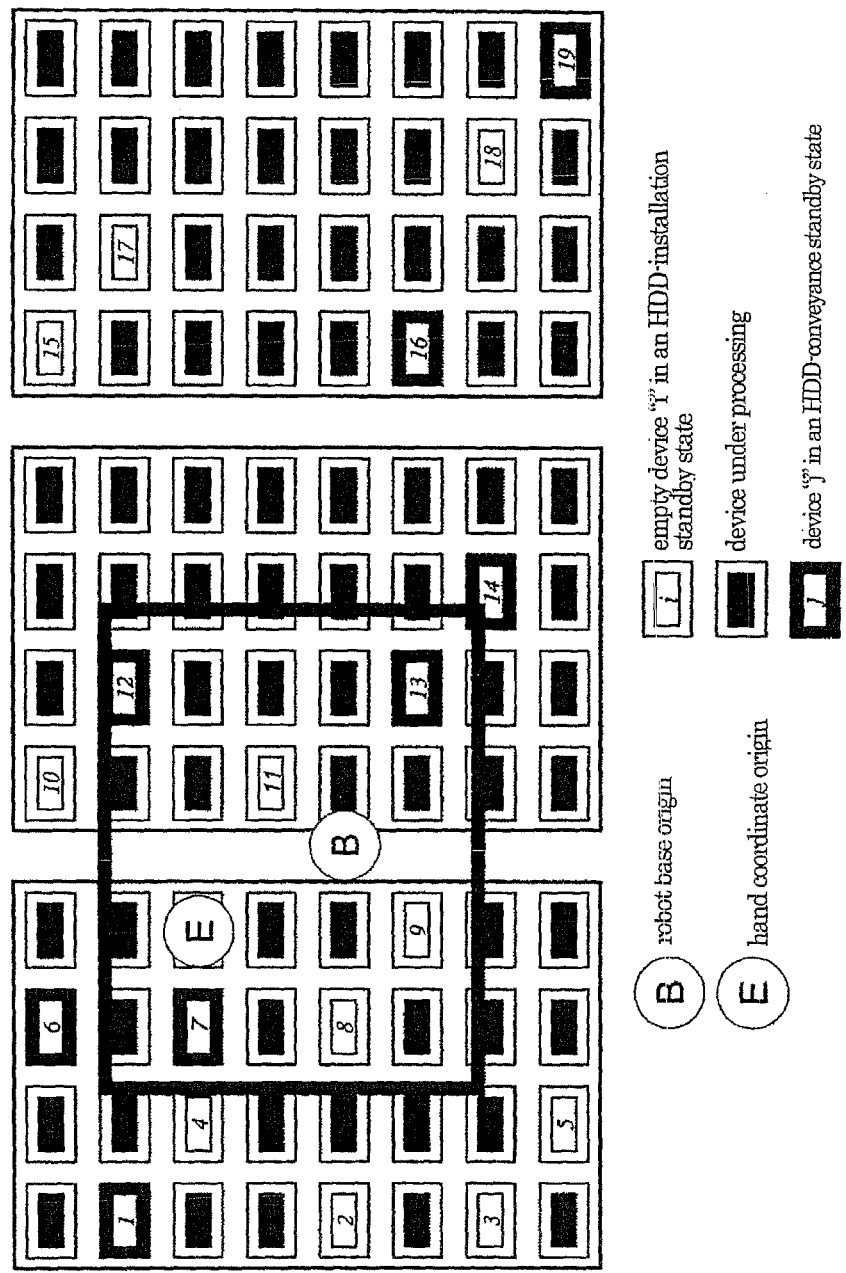
FIG. 11 is a view for graphically illustrating a flowchart described in conjunction with FIG. 10, of example 1, in accordance with embodiments of the present invention.

With reference now to FIG. 11, in accordance with an embodiment of the present invention, a view is shown for graphically describing the detailed flowchart described in conjunction with FIG. 10. In FIG. 11, a region surrounded by a rectangle outlined in bold lines indicates the robot working range, symbol "B" indicates a robot base origin, and symbol "E" indicates a hand coordinate origin. In addition, a white bordered rectangle containing a number indicates an empty device in an HDD-installation standby state, and a black bordered rectangle containing a number indicates an HDD in a conveyance standby state. With respect to the HDD conveyance operation, a basic operation is that the HDD is obtained from the device in an HDD-conveyance standby state and the obtained HDD is conveyed to and installed in the empty device in an HDD-installation standby state. In FIG. 11, the devices in an HDD-conveyance standby state existing in the robot working range are devices which are given "7", "12" and "13", and the empty devices in an HDD-installation standby state in the robot working range are devices which are given "8", "9" and "11". Further, the device in an HDD-conveyance standby state existing outside the robot working range are devices which are given "1", "6", "14", "16" and "19", and the empty devices in an HDD-installation standby state outside the robot working range are devices which are given "2", "3", "4", "5", "10", "15", "17" and "18". Here, according to the flowchart shown in FIG. 9 and the flowchart shown in FIG. 10, an HDD is obtained from the device "7" in an HDD-conveyance standby state which is located closest to the robot hand coordinate origin "E" and the obtained HDD is conveyed to and installed in the empty device "11" in an HDD-installation standby state which is located closest to the robot hand coordinate origin "E". In one supposed operation plan, for example, considering the case in which the HDD is obtained from the device "7" in an HDD-conveyance standby state which is located closest to the robot hand coordinate origin "E" and the obtained HDD is conveyed to and installed in the empty device "10" in an HDD-installation standby state existing outside the present robot working range, in addition to the operation of the robot 60, the robot base origin 64 is moved by operating the gantry 52, so that conveyance time is prolonged. Furthermore, considering another case in which the HDD is conveyed to and installed in the empty device "2" in an HDD-installation standby state existing outside the present robot working range from the device "19" in an HDD-conveyance standby state existing outside the present robot working range, in the same manner as described above, in addition to the operation of the robot 60, the robot base origin 64 is moved by operating the gantry 52, so that a conveyance time is prolonged. In contrast, example 1 is characterized in that, by conveying, with priority, the HDD in a conveyance standby state existing in the robot working range using the robot operation and without using the operation of the gantry 52 whose moving speed is relatively slow, as much as possible, the conveyance time can be shortened.

Figure 12:
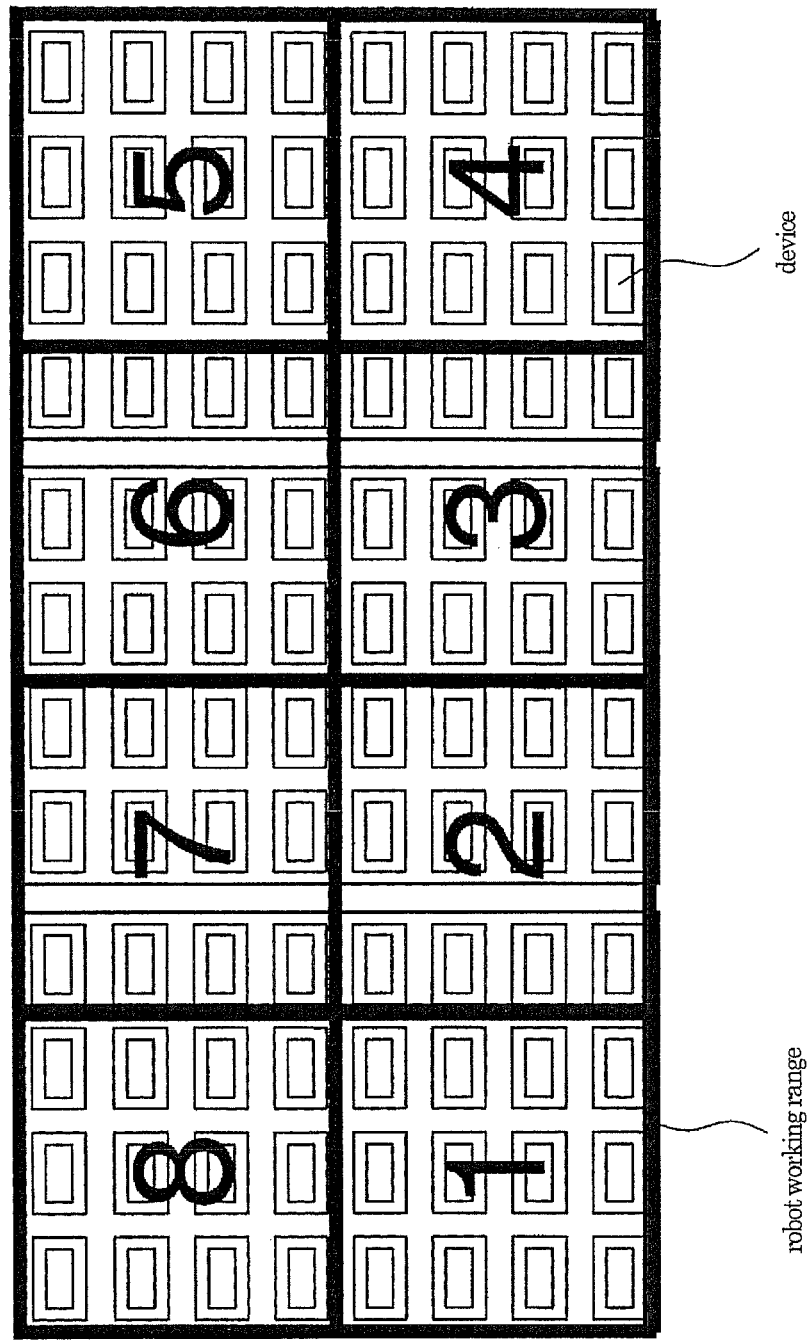
FIG. 12 is a view showing a situation in which a conveyance operation is efficiently performed with respect to a conveyance operation plan described in conjunction with FIG. 11, of example 1, in accordance with embodiments of the present invention.

With reference now to FIG. 12, in accordance with an embodiment of the present invention, a view is shown for describing a situation in which the conveyance operation can be performed efficiently with respect to the conveyance operation plan for example 1 described in conjunction with FIG. 11 of example 1. In FIG. 12, bold-line rectangles indicate the robot working ranges, and numbers in the respective rectangles indicate the order of operation. Thus, to consider a situation in which the HDD conveyance operation is completed within one robot working range, first of all, the HDD conveyance operation is performed by operating the robot while stopping the operation of the gantry in the robot working range 1. Next, the gantry is operated so that a robot working range 2 becomes the robot working range. Then, the gantry is stopped again, and the HDD conveyance operation is performed by operating the robot. By repeating such an operation from the robot working range 1 to robot working range 8, the conveyance system can perform an efficient conveyance operation.

Figure 13:
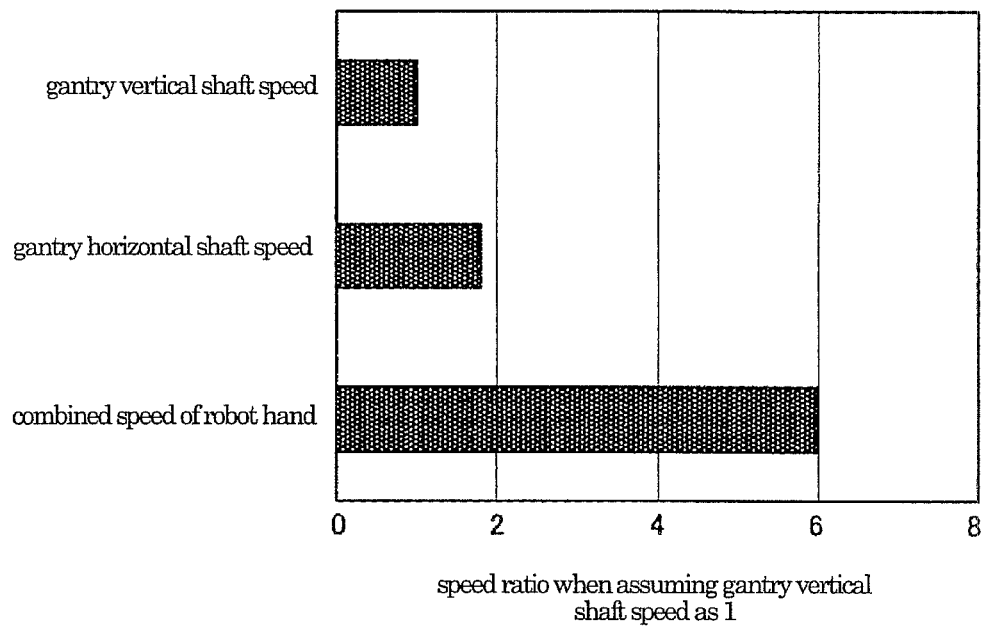
FIG. 13 is a view showing an increase in system movement speed by actually calculating the system movement speed, of example 1, in accordance with embodiments of the present invention.

With reference now to FIG. 13, in accordance with an embodiment of the present invention, a view is shown for describing an increase in system movement speed by actually calculating a movement speed of the system of example 1. FIG. 13 shows, in the system shown in FIG. 1 of example 1, a gantry horizontal shaft speed and a combined speed of the robot hand when the gantry is stopped assuming a gantry vertical shaft speed as "1" in a form of a laterally-extending bar chart. It is found from this chart that, assuming the gantry vertical shaft speed as "1", the gantry horizontal shaft speed of the gantry in the horizontal axis direction is 1.8 and a combined speed of the robot hand is 6. Thus, for example 1, it is found that, when the HDD in a conveyance standby state existing in the robot working range is conveyed with priority by operating the robot and without operating the gantry, as much as possible, the productivity of the system can be enhanced 6/1.8 times, that is, approximately 3 times.

Example 2

Figure 14:
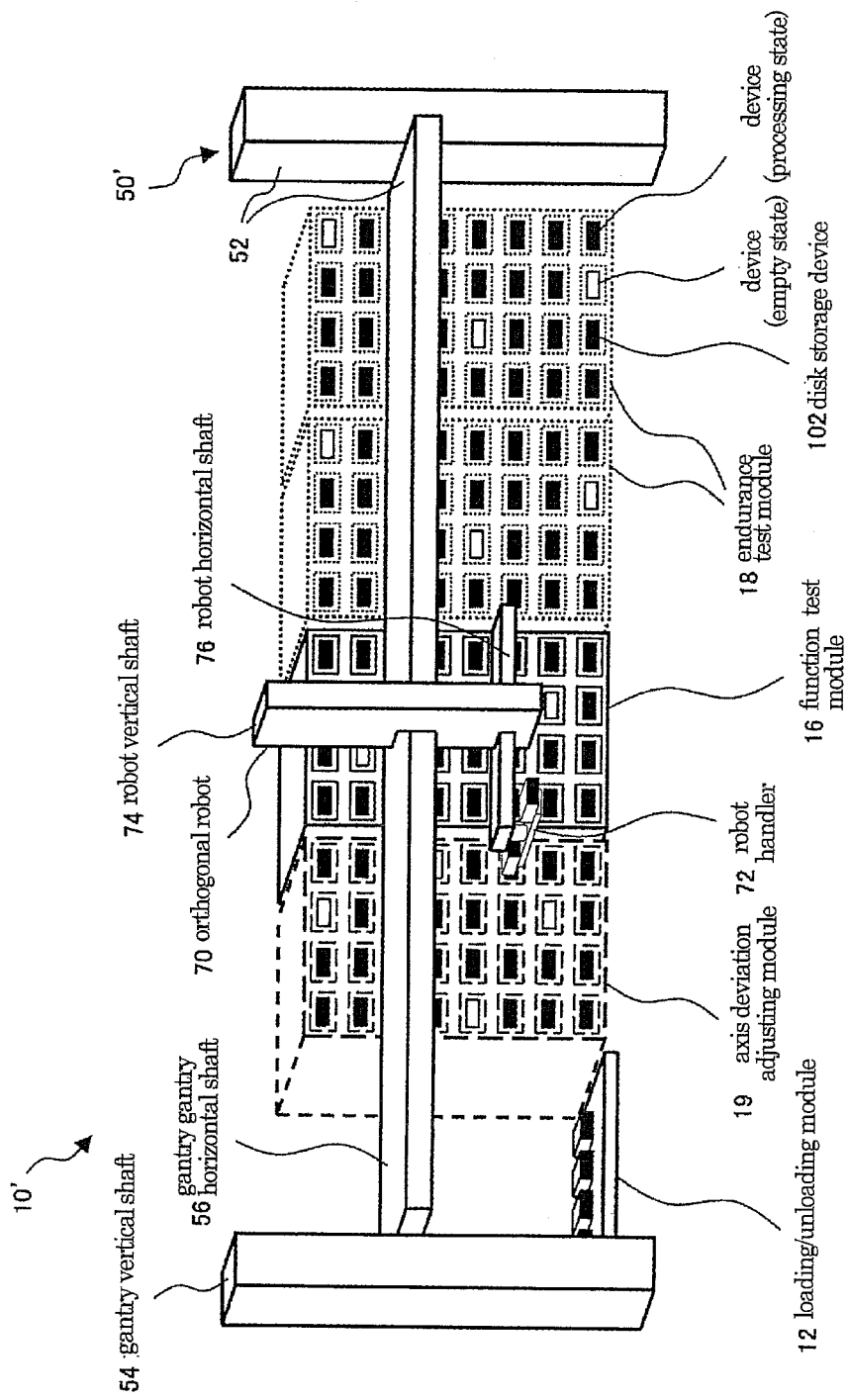
FIG. 14 is a schematic view of components of a conveyance system and an automated manufacturing system, of example 2, in accordance with embodiments of the present invention.

With reference now to FIG. 14, in accordance with an embodiment of the present invention, a schematic view is shown of example 2 of a conveyance system and an automated manufacturing system to which example 2 of the conveyance system is applied. In the automated manufacturing system 10', work, which is an article to be conveyed, is a disk-storage device 102 including an optical disk, a discrete track medium disk, or a bit-patterned medium disk. A conveyance system 50' adopts a mechanism for conveying the disk-storage device 102 in which an orthogonal robot 70, which is movable vertically and horizontally, is mounted on a gantry 52, which is a movable device that is also movable vertically and horizontally, and a robot handler 72, which is a gripper, is mounted on a hand of the robot. This system is, in a manufacturing process of the disk-storage device 102, assigned to an axis-deviation adjusting operation, a function test operation, and an endurance test operation. Furthermore, an axis-deviation adjusting module 19 is provided for the axis-deviation adjusting operation, and a plurality of manufacture processing devices 20 each of which performs an axis-deviation adjustment with respect to one disk-storage device is placed in the axis-deviation adjusting module 19. In the same manner as described above, a function test module 16 is provided for the function test, and an endurance test module 18 is provided for the endurance test. Furthermore, a plurality of devices 20 is placed in the function test module 16 and a plurality of devices 20 is placed in the endurance test module 18, respectively. In FIG. 14, the device in an empty state, in which the disk storage device 102 is not installed, is indicated by a white bordered rectangle; and, the device in a processing state, in which the disk storage device is installed, is indicated by a black bordered rectangle. Furthermore, as a station where the disk storage device 102 is loaded into the system and the disk storage device 102 is unloaded from the system, a loading/unloading module 12 is provided. The robot handler 72 removes the disk storage device from the station, and conveys the disk storage device to the device; and, the disk-storage device extracted from the device is conveyed to the station by the robot handler 72. The robot handler 72 is vertically and horizontally movable using a gantry vertical shaft 54 and a gantry horizontal shaft 56 and, at the same time, is vertically and horizontally movable using a robot vertical shaft 74 and a robot horizontal shaft 76. Thus, the robot handler 72 is vertically and horizontally movable using the gantry having two axes and the robot having two axes; and, therefore, the robot handler 72 has two redundant degrees of freedom. Thus, even when the operation of the gantry 52 is stopped, due to the operation of the robot 70, the robot handler 72 can arrive at a desired position provided that the desired position is within the working range of the robot 70. In accordance with an embodiment of the present invention, the specific configuration of components of the automated manufacturing system 10' according to example 2 is substantially the same as the configuration of components described in conjunction with FIGS. 2 through 13. Therefore, in accordance with an embodiment of the present invention, the automated manufacturing system of example 2 can achieve substantially the same results as obtained with example 1.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A conveyance system, comprising:
a movable device for conveying an article, said movable device configured to be both vertically and horizontally movable; and
a robot selected from the group consisting of an articulated robot and an orthogonal robot, said robot mounted on said movable device, said robot comprising:
a hand; and
a gripper disposed on said hand, said gripper configured to hold said article;
wherein said movable device and said robot are configured to convey said article in a series of conveyance operations comprising an extraction, a conveyance and an installation of said article, a range of said conveyance operations lying within a working range of said robot from a present position that is selected with priority; and
wherein said movable device is configured to remain in a stationary state when said article is conveyed by said robot using said conveyance operations within said working range.

2. The conveyance system of claim 1, wherein said working range is defined by four parameters comprising +X, −X, +Z, and −Z, wherein X is defined as a horizontal direction and Z is defined as a vertical direction with respect to an origin defined at a base of said robot.

3. The conveyance system of claim 1, wherein said movable device is configured to be moved in a direction selected from the group consisting of a vertical direction and a horizontal direction so as to determine a next working range after a conveyance of said article using said robot is completed within said working range.

4. The conveyance system of claim 1, wherein said gripper of said robot is capable of simultaneously gripping two articles.

5. The conveyance system of claim 1, wherein said conveyance system is configured to perform operations of a process for selecting said article with priority, said conveyance system configured:
- to perform an operation to recognize said article in a conveyance standby state;
- to perform an operation to confirm a processing program number of a next operation for said recognized article in a conveyance standby state;
- to perform an operation to confirm a processing program number of a manufacture processing device which is installed in a cell of said next operation to which said article is conveyable;
- to perform an operation to form at least one combination of a plurality of combinations of said article having a processing program number and a manufacture processing device having a processing program number wherein said processing program number of said article and said processing program number of said manufacture processing device agree with each other;
- to perform an operation to select at least one combination of said plurality of said combinations within said working range of said robot; and
- to perform an operation to select one combination of said plurality of said combinations within said working range of said robot that provides a shortest distance between said present position of said robot and a next position of said robot.

6. An automated manufacturing system comprising:
- a plurality of modules in which manufacture processing devices are installed in cells arranged in a matrix array;
- a first control component that is configured to transmit a processing program to said manufacture processing devices within said plurality of modules;
- a movable device that is configured to be both vertically and horizontally movable for conveying an article which is installed in said manufacture processing device to another manufacture processing device, and a robot selected from the group consisting of an articulated robot and an orthogonal robot mounted on said movable, said robot comprising:
  - a hand; and
  - a gripper disposed on said hand, said gripper configured to hold said article; and
- a second control component that is configured to control said movable device and said robot;
- wherein said first control component is configured to recognize a working range of said robot based on a present position of said movable device and a present position of said robot, to recognize a location of said article in a conveyance standby state based on a processing progress state of at least one of said manufacture processing devices, and to issue a conveyance command to said second control component while assigning high priority to said article within a working range of said robot and assigning low priority to said article to be conveyed outside said working range of said robot without moving said movable device; and
- wherein said second control component is configured to control said robot and said movable device so as to convey said article in accordance with said priorities.

7. The automated manufacturing system of claim 6, wherein said manufacture processing device of said cell comprises a socket, said article to be conveyed comprises a socket, and said socket of said manufacture processing device and said socket of said article are configured to be electrically connected with each other when said article is installed in said manufacture processing device and to enable manufacture processing in accordance with said processing program.

8. The automated manufacturing system of claim 6, wherein said article comprises a magnetic-recording device, and said plurality of modules comprises a servo track write module, a function test module, and an endurance test module.

9. The automated manufacturing system of claim 6, wherein said article comprises a magnetic-recording device, and said plurality of modules comprises an axial deviation adjusting module, a function test module, and an endurance test module.

10. The automated manufacturing system of claim 6, wherein said first control component is configured to execute:
- an operation to recognize said article in a conveyance standby state;
- an operation to confirm a processing program number of a next operation for said recognized article to be conveyed in a conveyance standby state;
- an operation to confirm a processing program number of a manufacture processing device that is configured to convey said article;
- an operation to form at least one combination of a plurality of combinations of said article having a processing program number and said manufacture processing device having a processing program number wherein said processing program number of said article and said processing program number of said manufacture processing device agree with each other;
- an operation to select at least one combination of said plurality of said combinations within said working range of said robot; and
- an operation to select one combination of said plurality of said combinations within said working range of said robot that is located closest to said present position of said robot, wherein when said combination is selected within said working range, said second control component is configured to control said robot so as to convey said article of said selected combination that is located closest to said present position of said robot to said manufacture processing device of said next operation without moving said movable device.

* * * * *